United States Patent
Mishra et al.

(10) Patent No.: US 7,525,130 B2
(45) Date of Patent: Apr. 28, 2009

(54) POLARIZATION-DOPED FIELD EFFECT TRANSISTORS (POLFETS) AND MATERIALS AND METHODS FOR MAKING THE SAME

(75) Inventors: Umesh K. Mishra, Montecito, CA (US); Huili Xing, South Bend, IN (US); Debdeep Jena, South Bend, IN (US); Siddharth Rajan, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/241,804

(22) Filed: Sep. 29, 2005

(65) Prior Publication Data
US 2006/0231860 A1   Oct. 19, 2006

Related U.S. Application Data

(60) Provisional application No. 60/614,585, filed on Sep. 29, 2004.

(51) Int. Cl.
*H01L 31/00* (2006.01)
(52) U.S. Cl. ............ 257/183; 257/192; 257/E29.249
(58) Field of Classification Search ............ 257/183, 257/192, E29.249, 193
See application file for complete search history.

(56) References Cited

U.S. PATENT DOCUMENTS

| | | | | |
|---|---|---|---|---|
| 4,814,836 | A * | 3/1989 | Thompson | 257/187 |
| 6,924,516 | B2 * | 8/2005 | Inoue et al. | 257/192 |
| 7,030,428 | B2 * | 4/2006 | Saxler | 257/194 |
| 2005/0077538 | A1 * | 4/2005 | Heikman | 257/183 |
| 2006/0017064 | A1 * | 1/2006 | Saxler et al. | 257/194 |
| 2006/0113564 | A1 * | 6/2006 | Kohn et al. | 257/192 |

OTHER PUBLICATIONS

Eastman, Lester F. et al.; "The Toughest"; 2002, *IEEE Spectrum*, pp. 28-33.

Gaquiere, C. et al.; "High-Power GaN MESFET on Sapphire Substrate"; 2000, *IEEE Microwave and Guided Wave Letters*, vol. 10, No. 1, pp. 19-20.

(Continued)

*Primary Examiner*—Tuan N. Quach
(74) *Attorney, Agent, or Firm*—Townsend and Townsend and Crew LLP

(57) ABSTRACT

Novel GaN/AlGaN metal-semiconductor field-effect transistor (MESFET) structures grown without any impurity doping in the channel. A high-mobility polarization-induced bulk channel charge is created by grading the channel region linearly from GaN to $Al_{0.3}Ga_{0.7}N$ over a distance, e.g., 1000 Å. A polarization-doped field effect transistor (PolFET) was fabricated and tested under DC and RF conditions. A current density of 850 mA/mm and transconductance of 93 mS/mm was observed under DC conditions. Small-signal characterization of 0.7 μm gate length devices had a cutoff frequency, $f_t=19$ GHz, and a maximum oscillation of $f_{max}=46$ GHz. The PolFETs perform better than comparable MESFETs with impurity-doped channels, and are suitable for high microwave power applications. An important advantage of these devices over AlGaN/GaN HEMTs is that the transconductance vs. gate voltage profile can be tailored by compositional grading for better large-signal linearity.

28 Claims, 5 Drawing Sheets

OTHER PUBLICATIONS

Gaska, R. et al.; "Highly doped thin-channel GaN-metal-semiconductor filed-effect transistors"; 2001, *Applied Physics Letters*, vol. 78, No. 6, pp. 769-771.

Jena, Debdeep et al.; "Realization of wide electron slabs by polarization bulk doping in graded III-V nitride semiconductor alloys"; 2002, *Applied Physics Letters*, vol. 81, No. 23, pp. 4395-4397.

Jimenez, A. et al.; "Effect of p-Doped Overlayer Thickness on RF-Dispersion in GaN Junction FETs"; 2002, *Applied Physics Letters*, vol. 23, No. 6, pp. 306-308.

Mishra, Umesh K. et al.; "AlGaN/GaN HEMTs-An Overview of Device Operation and Applications"; 2002, *Proceedings of the IEEE*, vol. 90, No. 6, pp. 1022-1031.

* cited by examiner

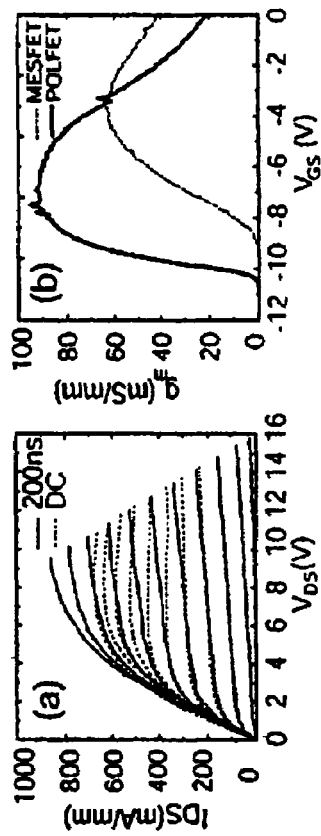
FIG. 4. (a) Dc and 200 ns pulsed *IV* characteristics of the PolFET (after passivation). The device dimensions are $L_g = 0.7$ μm and $W = 150$ μm. The gate was biased at −10 V and 200 ns pulses were applied. The topmost curves represent $V_G = 0$ V. (b) Transconductance for the PolFET and MESFET with $L_g = 0.7$ μm and $W = 150$ μm. The drain bias was 10 V.
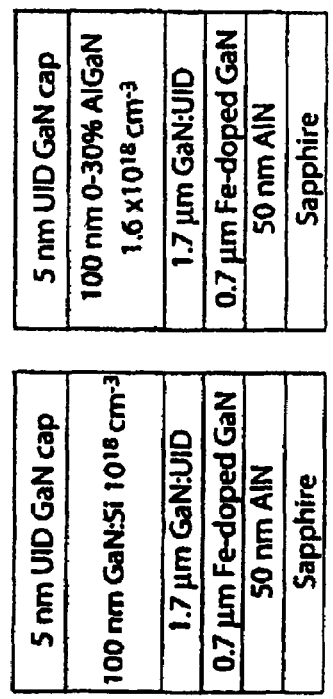
FIG. 2. Epitaxial structure of the (a) MESFET and (b) PolFET.

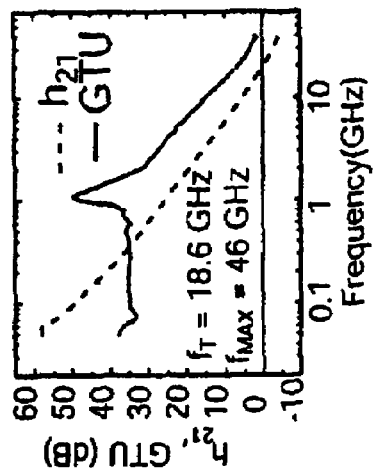

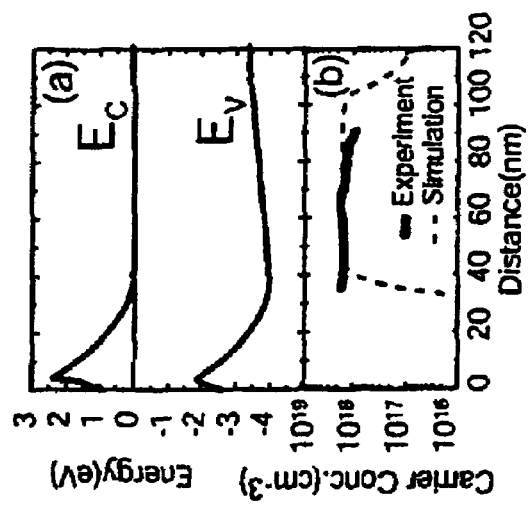

FIG. 3. (a) Zero bias band diagram of the PolFET assuming a 0.9 eV Schottky barrier for the metal-GaN junction. (b) Carrier concentration profiles from experiment (CV measurements) and simulations. This structure was simulated using BandEng (Ref. 12).

FIG. 5. Unilateral power gain (GTU) and current gain ($h_{21}$) from small-signal measurements of the PolFET. $f_t$ and $f_{max}$ were 18.6 and 46 GHz, respectively. The device was biased at $V_{DS} = 15$ V and $I_{DS} = 100$ mA/mm.

$g_m$ versus $I_{DS}$ Profile

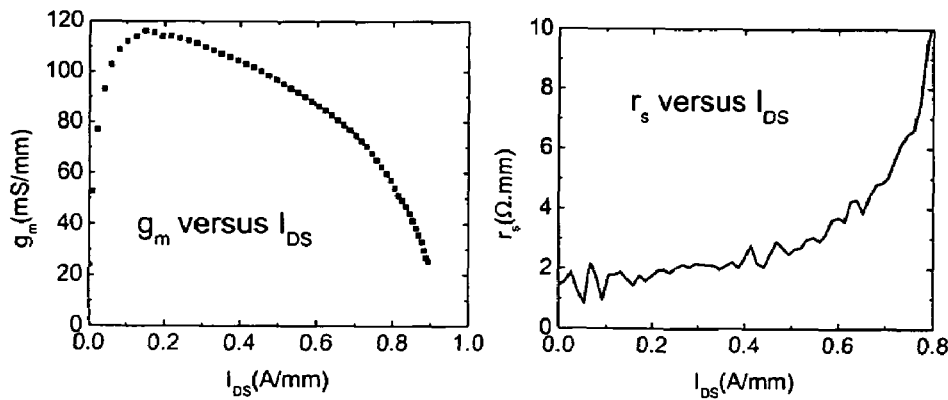

Transconductance $g_m = \dfrac{C_{GS} v_{EFF}}{1 + C_{GS} v_{EFF} r_S}$

- $r_s$ = <u>differential</u> source resistance
- Changing the grading profile alters $C_{GS}$.
- By changing the $C_{GS}$ profile, the $g_m$ can be made more flat

FIG. 6a

$g_m$ : Parabolic Grade

Parabolic grade leads to a more flat $g_m$ profile
Further modifications are possible using different grading schemes

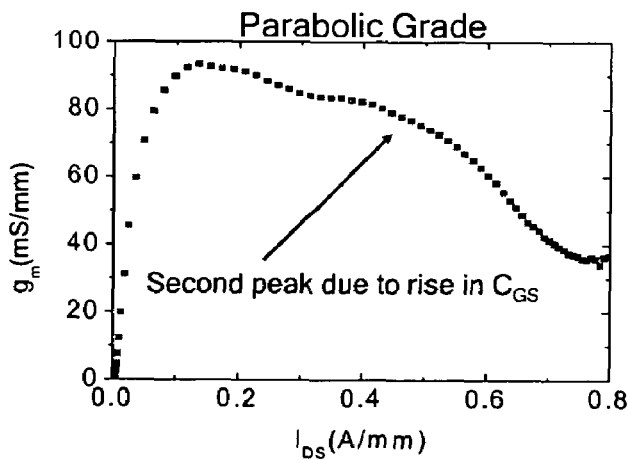

FIG. 6b

TABLE I. Comparison between PolFET and previous field-effect transistors (NR: not reported, JFET: junction field-effect transistors).

| Author(s) | Year | Device | $g_m$ | $L_g$ | $f_t$ | $f_{max}$ | Power |
|---|---|---|---|---|---|---|---|
| This work | 2003 | PolFET | 93 mS/mm | 0.7 μm | 18.6 GHz | 44 GHz | NR |
| Gaska et al. (Ref. 8) | 2002 | MESFET | NR | 1.5 μm | 6 GHz | 12 GHz | 0.6 W/mm at 2 GHz |
| Jiménez et al. (Ref. 6) | 2001 | JFET | 67 mS/mm | 0.7 μm | NR | NR | NR |
| Gaquiere et al. (Ref. 7) | 2000 | MESFET | NR | 0.3 μm | 11 GHz | NR | 2.2 W/mm at 2 GHz |
| Lee et al. (Ref. 10) | 2000 | MESFET | 36 mS/mm | 0.25 μm | 26 GHz | 54 GHz | NR |
| Binari et al. (Ref. 9) | 1994 | MESFET | 20 mS/mm | 0.7 μm | 8 GHz | 17 GHz | NR |

POLARIZATION-DOPED FIELD EFFECT TRANSISTORS (POLFETS) AND MATERIALS AND METHODS FOR MAKING THE SAME

CROSS-REFERENCES TO RELATED APPLICATIONS

This application claims the benefit of U.S. Provisional Application 60/614,585, filed Sep. 29, 2004, titled "Polarization-Doped Field Effect Transistor (POLFETS) and Materials and Methods for Making the Same" which is hereby incorporated by reference in its entirety.

STATEMENT AS TO RIGHTS TO INVENTIONS MADE UNDER FEDERALLY SPONSORED RESEARCH AND DEVELOPMENT

The government may have certain rights to the invention based in ONR/CANE MURI Grant Number N00014-01-1-0764 and ONR/POLARIS MURI Grant Number N00014-99-1-0729.

BACKGROUND OF THE INVENTION

The present invention relates generally to materials for use in transistors, and more particularly to polarization-induced bulk doping in electronic materials exhibiting strong spontaneous and/or piezoelectric polarization (e.g., ferroelectric and/or piezoelectric materials), and the use of these materials in forming high electron mobility field-effect transistor devices.

Prior to the present invention, bulk doping in electronic materials has been achieved by impurity doping, which is well characterized by a shallow "hydrogenic" model. The carrier concentration and transport properties are determined by temperature, dopant concentration and scattering mechanisms including impurity scattering and phonon scattering etc. Therefore, the carrier mobility always suffers from impurity scattering and the carrier concentration decreases as temperature decreases. A good understanding on this matter led to the concept of modulation doping, which improved low temperature carrier mobilities in quantum-confined structures by many orders of magnitude.

In recent years, III-V Nitrides have emerged as important materials for high-power microwave electronic applications. [See, e.g., Mishra et al., Proceedings of the IEEE 90, 1022 (2002); L. F. Eastman and U. K. Mishra, IEEE Spectrum 39, 28 (2002)]. In particular, crystals such as III-Nitrides, Zinc Oxide and Lithium Niobate, etc., exhibit large embedded electronic polarization fields owing to the lack of inversion symmetry in the crystal structure. This implies there exists a dipole in each unit cell of the crystal. For a homogeneous bulk crystal surface, dipoles inside the crystal cancel and leave net opposite charges on the opposing crystal surface, which is characterized by spontaneous polarization. Dipoles can also be created when a crystal is under strain, characterized by piezoelectric polarization. Both spontaneous polarization and piezoelectric polarization have been exploited for applications in communications, radar, infrared imaging, memories, integrated optics etc.

In the most successful Nitride electronic devices, high-electron mobility transistors (HEMTs), the strong spontaneous and piezoelectric polarization fields in AlGaN and GaN have been used to make nominally un-doped two-dimensional electron gases (2DEGs) in AlGaN/GaN heterostructures. These devices have yielded excellent power and efficiency performance at microwave frequencies.

In addition to high power and efficiency, devices for many wireless applications are also required to have high linearity at microwave frequencies. Design of such linear devices for large-signal operation needs tailoring of the transconductance ($g_m$) profile over the input gate voltage ($V_g$) range. However, the structure of traditional AlGaN/GaN HEMT-like devices does not lead itself to easy modification of the $g_m$-$V_{gs}$ profile. It has been shown that the $g_m$-$V_{gs}$ curve of metal semiconductor field effect transistors (MESFETs) can be tailored by designing the channel doping profile. [See, R. E. Williams and D. W. Shaw, IEEE Trans. Electron Device, ED-25, 600-605 (1978); R. Pucel, Electron. Lett., 14, 204 (1978); J. A. Higgins and R. L. Kuvas, IEEE Trans. Microwave Theory Tech., MTT-28, 9 (1980)]. GaN MESFETs therefore remain attractive for high-linearity microwave power applications. However, the device designer is constrained in their choice of channel charge due to gate leakage, breakdown and impurity scattering limited mobility.

Accordingly, it can be seen that there is a need for improved materials and devices, such as HEMT devices, for use in microwave power and other applications. Such materials and devices should overcome some or all of the above deficiencies and constraints.

BRIEF SUMMARY OF THE INVENTION

The present invention provides improved materials and devices, and in particular Field Effect Transistor (FET) devices, that are useful in microwave power and other applications. According to the present invention, a device structure includes a region where the alloy composition of the AlGaN (or InGaN) alloy is changed over a certain distance. The built-in polarization fields induce a 3-dimensional electron or hole gas that may then be used as the channel of a polarization-doped field-effect transistor or PolFET According to one aspect of the present invention, a III-V Nitride-based field effect transistor (FET) is provided that typically includes a polarization doped channel underlying source, gate and drain contacts, which may or may not be ohmic contacts. In certain aspects, the channel comprises a compositionally graded Nitride layer where compositional grading is done between any two Nitride based alloys such that the resulting polarization creates a conducting channel, e.g., either an n-type or a p-type conducting channel. For example, in one aspect, the channel includes $Al_xGa_{1-x}N$ graded over a distance to $Al_yGa_{1-y}N$, where x and y are different and where x and y are each selected from a range from about 0 to 1.0, and where the grading distance may range from about 1.0 nm to about 1,000 nm or more. In one aspect, x is 0 and y is about 0.3. In another aspect, compositional grading may be done using InGaN-based alloys in Ga-polar orientation or in N-polar orientation. In another aspect, compositional grading may be done using AlInGaN-based alloys in Ga-polar orientation or in N-polar orientation. The grading function may be a linear function, a parabolic function or other function. In certain aspects, the compositional grading function is selected to specifically change or improve the transconductance profile, microwave linearity and/or other properties of the FET.

According to one aspect of the present invention, a III-V Nitride based heterostructure is provided that typically includes a polarization doped III-V Nitride composition. In certain aspects, the composition comprises a compositionally graded Nitride layer where compositional grading is done between any two Nitride based alloys such that the resulting polarization creates a conducting channel, e.g., either an n-type or a p-type conducting channel. For example, in one aspect, the composition includes $Al_xGa_{1-x}N$ graded over a distance to $Al_yGa_{1-y}N$, where x and y are different and where x and y are each selected from a range from about 0 to 1.0, and where the grading distance may range from about 1.0 nm to about 1,000 nm or more. In one aspect, x is 0 and y is about 0.3. In another aspect, compositional grading may be done using InGaN-based alloys in Ga-polar orientation or in N-polar orientation. In another aspect, compositional grading may be done using AlInGaN-based alloys in Ga-polar orientation or in N-polar orientation. The grading function may be a linear function, a parabolic function or other function. In certain aspects, the compositional grading function is selected to specifically change or improve the transconductance profile, microwave linearity and/or other properties of the composition.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

FIG. 2 shows the structure of a) a conventional impurity doped MESFET, and b) an example of a PolFET according to the present invention.

FIG. 3 shows a) a calculated band diagram of a PolFET structure of the present invention at zero bias, and b) carrier concentration profiles from experiment and simulations.

FIG. 4 shows a) DC and pulsed characteristics of a PolFET according to the present invention, and b) transconductance for a PolFET and a MESFET.

FIG. 5 shows unilateral power gain (GTU) and current gain ($h_{21}$) for a PolFET according to the present invention.

FIGS. 6a-6b illustrate aspects of transconductance profile tailoring according to the present invention.

Figure 1:
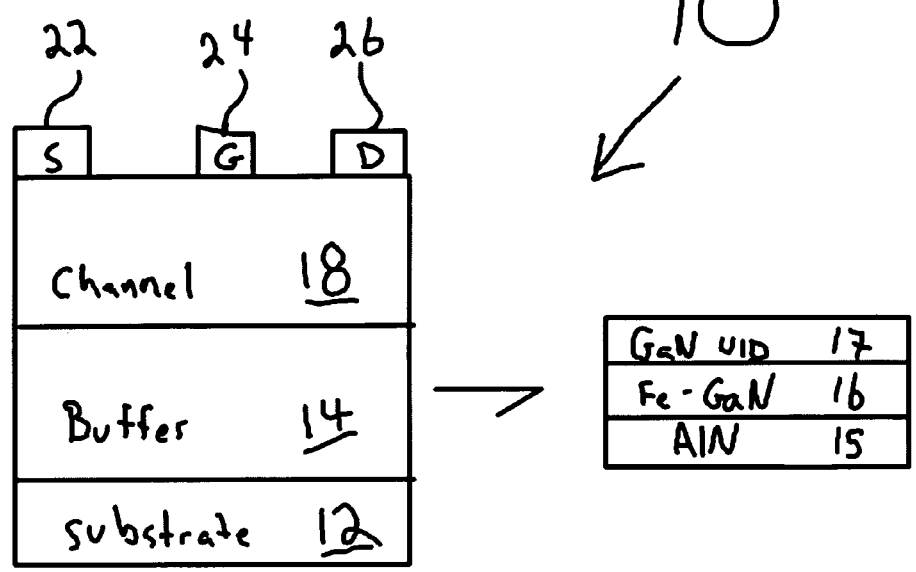
FIG. 1 illustrates a sectional view of a HEMT (PolFET) according to the present invention.

TABLE I shows comparison between POLFET and Previous filed-effect transistors.

DETAILED DESCRIPTION OF THE INVENTION

The present invention provides improved materials and devices for use in microwave power and other applications. In one aspect, improved device performance results from the superior carrier transport properties achieved by polarization-induced bulk electron doping, compared with impurity-doped carriers, which are highly desirable for electronic devices. Junction field effect transistors (JFETs) and metal-semiconductor field effect transistors (MESFETs), and other devices can be made in III-V Nitride material systems using the techniques and teachings of the present invention. In one aspect, in devices according to the present invention, an electron channel is formed by grading across a heterojunction, such as an AlGaN/GaN heterojunction, over a distance. For example, in certain aspects, device templates may be created by grading linearly from $Al_xGa_{1-x}N$ to $Al_yGa_{1-y}N$ on (0001) semi-insulating GaN, where x and y are typically different and where x may range from 0 (GaN) to 1.0 and where y may range from 0 to 1.0. Additionally, the compositional grading function used need not be linear, for example the grading function could be parabolic.

FIG. 1 shows one embodiment of a HEMT device structure 10 constructed in accordance with the present invention. HEMT structure 10 includes a buffer layer 14 on a substrate 12. In one aspect, substrate 12 comprises sapphire ($Al_2O_3$), although substrate layer 12 may comprise silicon carbide (SiC), gallium nitride (GaN), silicon (Si) or any other useful substrate material. A channel layer 18 is included on buffer layer 14.

HEMT structure 10 can be fabricated using many different material systems, but is preferably fabricated using Group III-V nitride based material systems. Group III nitrides, for example, refer to those semiconductor compounds formed between nitrogen and the elements in the Group III of the periodic table, such as aluminum (Al), gallium (Ga), and indium (In). The term also refers to ternary and quaternary compounds such as AlGaN and AlInGaN.

As shown in FIG. 1, in certain aspects, buffer layer 14 includes one or more sub-layers. For example, for a GaN-based system as shown, in one aspect, buffer layer 14 may include a AlN sublayer 15, an Fe-doped GaN sublayer 16 and an unintentionally doped (UID) GaN layer 17. The total thickness of buffer layer 14 may vary depending on the materials used and the intended application of HEMT structure 10. For example, buffer layer 14 may have a thickness in the range of 0 to 10 µm or greater. For example, in the specific GaN system example shown, sublayer 15 may have a thickness of between about 0 to about 100 nm, sublayer 16 may have a thickness in the range of about 0 to about 1.0 µm or greater, and sublayer 17 may have a thickness in the range of about 0 to about 2.0 µm or greater.

In one embodiment, channel layer 18 includes a polarization induced bulk doping layer formed by grading the composition of the channel layer material. In certain aspects, the composition of the channel comprises a first Nitride based alloy compositionally graded to a second Nitride based alloy over a grading distance. For example, the first and second Nitride based alloys may each comprise one of InGaN, AlInGaN, GaN or AlGaN. For example, in one aspect, channel layer 18 is formed by linearly grading from $Al_xGa_{1-x}N$ to $Al_yGa_{1-y}N$ over a grading distance, where x and y are different and each have a range of from about 0 to about 1.0. In one aspect x is approximately 0 and y is approximately 0.3. In certain aspects, the grading distance/thickness of the graded material may range from about 1.0 nm to about 1,000 nm. In preferred aspects, the grading distance is about 50 nm to about 200 nm.

As shown in FIG. 1, HEMT structure 10 also includes source, drain and gate contacts 22, 24, 26. The source and drain contacts 22, 26 can be made of different materials including but not limited to an alloy of titanium, aluminum, or nickel. The gate contact 24 can also be made of different materials including but not limited to titanium, platinum, chromium, alloys of titanium and tungsten, or platinum silicide.

HEMT structures according to the present invention can be fabricated using all Group III nitrides and their alloys. Additionally, the HEMT structures can be fabricated using different processes including but not limited to, metalorganic chemical vapor deposition (MOCVD), molecular beam epitaxy (MBE), vapor-phase epitaxy (VPE) and others. Also, the channel layer can be formed in various environments such as hydrogen, nitrogen or ammonia carrier gasses.

In the HEMTs of the present invention, such as an AlGaN/GaN HEMT, a fixed sheet charge is formed at the heterointerface due to the piezoelectric polarization in the strained AlGaN, and the discontinuity in the spontaneous polarization at the interface. To screen the net positive charge at the AlGaN/GaN junction, a 2DEG is formed. Jena et al. have shown that the same effect can also be used to create a bulk three-dimensional electron slab. [See, Jena et al., Appl. Phy. Lett., 81, 4395 (2002).] This is achieved by grading from GaN to AlGaN, thus spreading the polarization-induced charge over the graded region. The polarization-induced carrier $\rho_\pi$ is given by the equation $\rho_\pi = \Delta \cdot P$, where P is the total polarization in the material. Since the AlGaN composition and polarization are shown to be well-approximated by Vegard's law, any desired channel charge profile can be obtained by choosing the appropriate grading scheme. This can be used to tailor the $g_m$-$V_{gs}$ profile of the PolFET. This is analogous to impurity doped MESFETs, where the $g_m$-$V_{gs}$ profile is modified by dopant profile design. For example, the transconductance ($g_m$) profile may be made more flat by using a parabolic grading scheme. In general, $g_m$ is a function of $C_{GS}$:

$$g_m = (C_{GS} \times V_{EFF})/(1 + (C_{GS} * V_{EFF} * r_S)),$$

where $C_{GS}$ is the gate-source capacitance, $V_{EFF}$ is the effective electron velocity in the channel, and $r_S$ is the differential source resistance. Changing the grading profile alters $C_{GS}$, and by changing $C_{GS}$, the $g_m$ profile can be altered, e.g., made more flat. FIG. 6 illustrates an example of modifying the $g_m$ profile using parabolic grading.

A PolFET according to the present invention has many advantages over conventional MESFETs. Since the PolFET channel is polarization-doped, there is no ionized impurity scattering, and the electron mobility is much higher than in impurity-doped MESFETs. This property can be used to make highly conductive channels and access regions in devices. Gate leakage is an important problem in MESFETs since the Schottky barrier to GaN is low. This is improved in the PolFET because the channel is graded, e.g., from GaN to AlGaN, leading to a higher effective barrier height. In this example, AlGaN has a higher breakdown field than GaN, which permits the use of higher channel charge concentrations. Therefore, the PolFET structure permits a higher channel charge than a conventional MESFET, but still allows the designer to modify the channel carrier concentration profile.

Additionally, impurity-doped MESFETs cannot operate at lower temperatures due to freeze-out of carriers. Since the mobile carriers in the PolFET are electrostatically induced by the fixed polarization charge, there is no freeze-out at lower temperatures. As in a HEMT, the performance of the PolFET improves at lower temperatures since phonon scattering is reduced, and the mobility is higher. See, Jena et al., Appl. Phy. Lett., 81, 4395 (2002).

For comparison, two samples, a conventional impurity-doped MESFET, and a polarization-doped FET, or PolFET, according to the present invention were studied (FIG. 2). The samples were grown by metalorganic chemical vapor deposition (MOCVD) on sapphire substrates. Both devices have the same buffer layer: 0.7 µm Fe-doped GaN, 50 nm AlN and 1.7 µm unintentionally doped (UID) GaN as shown. For the PolFET, a 100 nm channel including GaN linearly graded to $Al_{0.3}Ga_{0.7}N$ was formed on the buffer layer as shown. In the case of the MESFET, the channel includes 100 nm of GaN:Si doped at $10^{18} cm^{-3}$. Both devices have a 5 nm UID GaN cap.

The calculated band diagram of the PolFET structure at zero bias is shown in FIG. 3(a). The band diagram was calculated using a self-consistent one-dimensional Schrodinger-Poisson solver with built-in polarization fields. [See, M. Grundmann, BandEng Alpha Version (2003), http://my-.ece.ucsb.edu/mgrundmann/banding.htm.] A Schottky barrier height of 0.9 eV at the top surface of the structure was assumed. The carrier profile from CV measurements agrees well with the simulated profile, as shown in FIG. 3(b). An average charge of $1.6 \times 10^{18} cm^{-3}$ was measured for a linear grade up to 30% AlGaN over 100 nm. The MESFET sample was found to have a carrier concentration of $10^{18} cm^{-3}$ in the channel. Hall mobilities were measured to be 800 cm²/Vs for the PolFET sample and 500 cm²/Vs for the MESFET. As expected, the mobility in the polarization doped sample is higher than the impurity doped MESFET sample.

Field effect transistors were fabricated on both samples. Ohmic contacts were made by evaporating Ti/Al/Ni/Au and annealing at 870° C. Mesa isolation was performed used $Cl_2$ reactive ion etching. Ni/Au contacts were evaporated for the gate metal, and the surface was passivated with silicon nitride to reduce high-frequency dispersion. The devices fabricated were 150 µm wide, with a gate length of 0.7 µm, and a source-drain spacing of 3.4 µm. It will be appreciated that other design parameters, conditions, sizes and materials may be used to form field effect transistors and other devices on such structures.

DC and 200 ns pulsed I-V plots for the PolFET are shown in FIG. 4(a). The pulsed drain current at zero gate bias for the PolFET was 850 mA/mm and the pinch-off voltage was -10V. The DC currents are lower than the pulsed values at higher current levels due to self-heating in the sample. In comparison, the MESFET had a lower current (600 mA/mm) and pinched off at -8V gate bias, due to lower charge. The knee voltage for the POLFET was 5V, which is lower than the MESFET value of 7V. This is because of the lower sheet resistance in the PolFET. The MESFET was also found to have high gate leakage and a low breakdown due to the high level of doping in the channel. The PolFET, on the other hand, had less gate leakage, and higher breakdown voltage in spite of the higher channel charge.

The measured variation of transconductance, $g_m$ with the gate bias, $V_{gs}$, at a drain voltage of 10V is shown in FIG. 4(b). The peak transconductance for the PolFET, 93 mS/mm, is the highest reported value for a GaN MESFET device. The dip in the transconductance at higher drain voltages and currents is due to the self-heating in the sample.

High frequency small-signal characterization of the devices from 50 MHz to 40 GHz was carried out, and the current gain ($h_{21}$) and unilateral power gain (GTU) were calculated from the measured s-parameters of the device. FIG. 5 shows $h_{21}$ and GTU as a function of input signal frequency. The measured $f_\tau$ and $f_{max}$ values were 18.6 GHz and 46 GHz respectively. The device was biased at $V_{DS}$=15V and $I_{DS}$=100 mA/mm.

In Table 1, the $f_\tau$ and $f_{max}$ values of the PolFET are compared with earlier MESFET and junction Field-effect transistor (JFET) results. The PolFET outperforms all past MESFETs due to its higher mobility and charge. Also, the PolFET performs as well as typical AlGaN/GaN HEMTs with similar gate lengths.

In summary, polarization-doped GaN FETs were grown and fabricated on Sapphire substrates. They were found to have excellent DC and small-signal performance with $g_m$=93 mS/mm, $f_\tau$=19 GHz, and $f_{max}$=46 GHz. These values are the best reported yet for MOSFETs. PolFETs are therefore very useful for high-frequency, high-power applications. An important advantage of these devices over HEMTs is that they allow for optimization of the $g_m$-$V_{gs}$ profile for improved linearity. As an added advantage, PolFETs perform well at lower temperatures where impurity doped MESFETs fail due to carrier freeze-out. It should be noted that PolFET-like structures as taught herein can be realized in any material system that possesses sufficiently high spontaneous or piezoelectric polarization. Oxides and other II-VI semiconductors with suitable properties can therefore be used for devices utilizing polarization doping. Suitable examples include ZnO, MgO and LiNbO$_3$.

A summary of some of the advantages and modifications/alternatives to the materials and devices of the present invention follows.

Advantages of the present invention relative to prior device structures includes:

1. Because no dopants are used, ionized impurity scattering of carriers is absent, and polarization-induced carrier mobilities are higher than similar impurity-doped channels. Furthermore, the mobilities increase with carrier concentrations due to increasing screening effects from mobile carriers, on the contrary to impurity doping scheme. Therefore, the conductivity of polarization-doped semiconductor is high.

2. The higher conductivity in the polarization-doped channel and access regions leads to lower knee voltage, higher current and higher transconductance than in impurity doped FETs. High-frequency figures of merit, such as the cutoff frequency, $f_t$, and maximum oscillation frequency $f_{max}$, are also higher for polarization-doped devices.

3. Because carriers are induced electrostatically in polarization-doped structures, the carrier concentration does not change at low temperatures with increase in mobility. As a result, the performance of devices using polarization-doped channels improves at low temperatures.

4. The maximum electric field in during pinch-off is at the top of the channel, where the material is higher in Al content. The breakdown electric field of AlGaN is higher than that of GaN. Therefore, polarization-doped graded structures with higher channel charge than conventional GaN MESFETs can be designed.

5. Different carrier profiles can be created by choosing the appropriate grading profiles in the channel. In a FET, the transconductance ($g_m$) vs. gate voltage ($V_{GS}$) curve is related to the carrier profile. Therefore, a desired $g_m$-$V_{GS}$ profile can be obtained by engineering the grade. Many device properties including linearity, noise figure and harmonic generation are dependent on $g_m$-$V_{GS}$ profile. Therefore, these device properties can be tailored by engineering the grading profile in the device.

Additional modifications and alternatives to the structures and methods described herein include:

i. Formation of n-type layer grading from InGaN to GaN or Al GaN on (0001) InGaN templates.
  ii. Formation of n-type layer grading from (Al)GaN to Ga(In)N on (000-1) (Al)GaN templates.
  iii. Formation of p-type layer grading from (Al)GaN to Ga(In)N on (0001) (Al)GaN templates.
  iv. Formation of p-type layer grading from (In)GaN to (Al)GaN on (000-1) (In)GaN templates.
  v. Various grading schemes other than linear grading apply, for example, exponential grading, parabolic grading, etc. and combinations of all kinds.
  vi. The alloy formation may be analog or digital.
  vii. The concept can be applied to any other ferroelectric and piezoelectric materials. They can be used to generate mobile carrier profiles by graded heterojunctions or the combinations of graded and abrupt heterojunctions. The following materials can be used, including, and not limited to, ZnO, MgO, LiNbO$_3$.
  viii. A polarization-doped region can be used in devices other than FET channel layers, including, and not limited to, barrier layers, contact layers, bipolar devices structures, etc.

All publications referred to herein are hereby incorporated by reference.

While the invention has been described by way of example and in terms of the specific embodiments, it is to be understood that the invention is not limited to the disclosed embodiments. To the contrary, it is intended to cover various modifications and similar arrangements, in addition to those discussed above, as would be apparent to those skilled in the art. For example the distance over which grading of a composition occurs can range greatly, e.g., on the order of 1.0 nm or less to 1,000 nm or more. Therefore, the scope of the appended claims should be accorded the broadest interpretation so as to encompass all such modifications and similar arrangements.

What is claimed is:

1. A III-V Nitride-based field effect transistor (FET) comprising a polarization doped channel underlying source, gate and drain contacts, wherein the channel comprises a first Nitride based alloy compositionally graded to a second Nitride based alloy over a grading distance to induce a continuous 3-dimensional electronic charge distribution in the channel.

2. The FET of claim 1, wherein the channel comprises $Al_xGa_{1-x}N$ compositionally graded over a distance to $Al_yGa_{1-y}N$, where x and y are different, wherein x and y are each selected from a range of about 0 to 1.0.

3. The FET of claim 2, wherein x and y are each selected from a range of 0 to 1.

4. The FET of claim 2, wherein x is 0 and y is approximately 0.3.

5. The FET of claim 2, wherein the grading distance is approximately 100 nm.

6. The FET of claim 2, wherein the channel is compositionally graded according to a compositional grading function selected to change or optimize one of a transconductance profile of the channel or microwave linearity.

7. The FET of claim 2, wherein the channel is compositionally graded according to a compositional grading function that includes a linear, exponential or parabolic function.

8. The FET of claim 2, the compositionally graded channel is one of an n-type conductive channel or a p-type conductive channel.

9. The FET of claim 1, wherein the first and second Nitride based alloys each comprise one of InGaN, AlInGaN, GaN or AlGaN.

10. The FET of claim 1, wherein the first and second Nitride based alloys are each in one of a Ga-polar orientation or an N-polar orientation.

11. The FET of claim 1, wherein the channel is compositionally graded according to a compositional grading function selected to change or optimize one of a transconductance profile of the channel or microwave linearity.

12. The FET of claim 1, wherein the channel is compositionally graded according to a compositional grading function that includes a linear, exponential or parabolic function.

13. The FET of claim 1, further comprising:
    at an edge of the channel, an abrupt heterojunction at the end of the grading distance.

14. The FET of claim 13, wherein the abrupt heterojunction is formed from a third Nitride based alloy between the compositionally graded channel and the source, gate and drain contacts, wherein the third Nitride based alloy has a higher Aluminum composition than the ending Aluminum composition of the graded region.

15. The FET of claim 14, wherein the first Nitride alloy comprises $Al_xGa_{1-x}N$ and the second Nitride alloy comprises $Al_yGa_{1-y}N$, where x and y are different and x is less than y, and wherein the third Nitride based alloy comprises $Al_zGa_{1-z}N$, wherein z is greater than y, wherein x, y, and z are each selected from a range of about 0 to 1.0.

16. The FET of claim 1, wherein the channel consists essentially of the first Nitride based alloy compositionally graded to the second Nitride based alloy over the grading distance to induce a continuous 3-dimensional electronic charge distribution in the channel.

17. The FET of claim 1, wherein the induced charge distribution conducts electrons between the source and the drain.

18. A III-V Nitride based heterostructure comprising a polarization doped III-V Nitride composition formed directly on a template wherein the composition comprises a compositionally graded region consisting of a first Nitride based alloy compositionally graded to a second Nitride based alloy over a grading distance to induce a continuous 3-dimensional electronic charge distribution in a the compositionally graded region of the composition, wherein the compositionally graded region is the only region of the polarization doped III-V Nitride composition that contains a polarization charge distribution.

19. The heterostructure of claim 18, wherein the composition comprises $Al_xGa_{1-x}N$ compositionally graded over a distance to $Al_yGa_{1-y}N$, where x and y are different, wherein x and y are each selected from a range of about 0 to 1.0.

20. The heterostructure of claim 19, wherein x and y are each selected from a range of 0 to 1.

21. The heterostructure of claim 19, wherein x is 0 and y is approximately 0.3.

22. The heterostructure of claim 19, wherein the grading distance is approximately 100 nm.

23. The heterostructure of claim 19, wherein the grading distance is between about 1.0 nm and about 1,000 nm.

24. The heterostructure of claim 18, wherein the template comprises one of a sapphire substrate, a silicon carbide substrate, a silicon substrate or a GaN substrate.

25. The heterostructure of claim 18, wherein the template comprises Fe-doped GaN, AlN and/or UID GaN layers.

26. The heterostructure of claim 18, wherein the first and second Nitride based alloys each comprise one of InGaN, AlInGaN, GaN or AlGaN.

27. A III-V Nitride-based field effect transistor (FET) comprising;

a polarization doped III-V Nitride composition formed on a template wherein the composition includes a compositionally graded region consisting of a first Nitride based alloy compositionally graded to a second Nitride based alloy over a grading distance to induce a continuous 3-dimensional electronic charge distribution in the compositionally graded region; and source, gate and drain contacts, wherein a channel of the FET does not exist between the compositionally graded region and the gate contact.

28. The FET of claim 27, wherein the source and drain contacts make an ohmic contact with the compositionally graded region.

* * * * *